United States Patent
Habring et al.

(10) Patent No.: US 7,009,449 B2
(45) Date of Patent: Mar. 7, 2006

(54) ADJUSTABLE GAIN AMPLIFIER ARRANGEMENT WITH RELAXED MANUFACTURING CONSTRAINTS

(75) Inventors: Gerhard Habring, Linz (AT); Manfred Haberl, Linz (AT); Andreas Scheiber, Linz (AT); Hans-Peter Fuchs, Traun (AT); Carl Stephelbauer, Ennsdorf (AT)

(73) Assignee: Infineon Technologies AG, Munich (DE)

( * ) Notice: Subject to any disclaimer, the term of this patent is extended or adjusted under 35 U.S.C. 154(b) by 96 days.

(21) Appl. No.: 10/822,633

(22) Filed: Apr. 12, 2004

(65) Prior Publication Data

US 2004/0227574 A1 Nov. 18, 2004

(30) Foreign Application Priority Data

Apr. 17, 2003 (DE) .............................. 103 17 936

(51) Int. Cl.
*H03F 3/45* (2006.01)

(52) U.S. Cl. ...................................... 330/254; 330/261
(58) Field of Classification Search ................ 330/254, 330/261, 296, 285, 279, 260; 455/274.1; 348/678
See application file for complete search history.

(56) References Cited

U.S. PATENT DOCUMENTS

| | | | |
|---|---|---|---|
| 5,606,272 A * | 2/1997 | Behbahani et al. | ........... 327/65 |
| 5,812,025 A | 9/1998 | Shimazaki | |
| 6,661,287 B1 * | 12/2003 | Lin et al. | ................... 330/254 |
| 6,791,414 B1 * | 9/2004 | Trodd et al. | ................ 330/254 |

* cited by examiner

*Primary Examiner*—Henry Choe
(74) *Attorney, Agent, or Firm*—Eschweiler & Associates, LLC

(57) ABSTRACT

An amplifier arrangement includes a variable-gain signal amplifier. A control block is used to process a control signal in order to set the gain. A trimming unit acts on the control block such that signals which are produced by the control block can be trimmed relative to one another in order to set the gain of the signal amplifier.

23 Claims, 2 Drawing Sheets

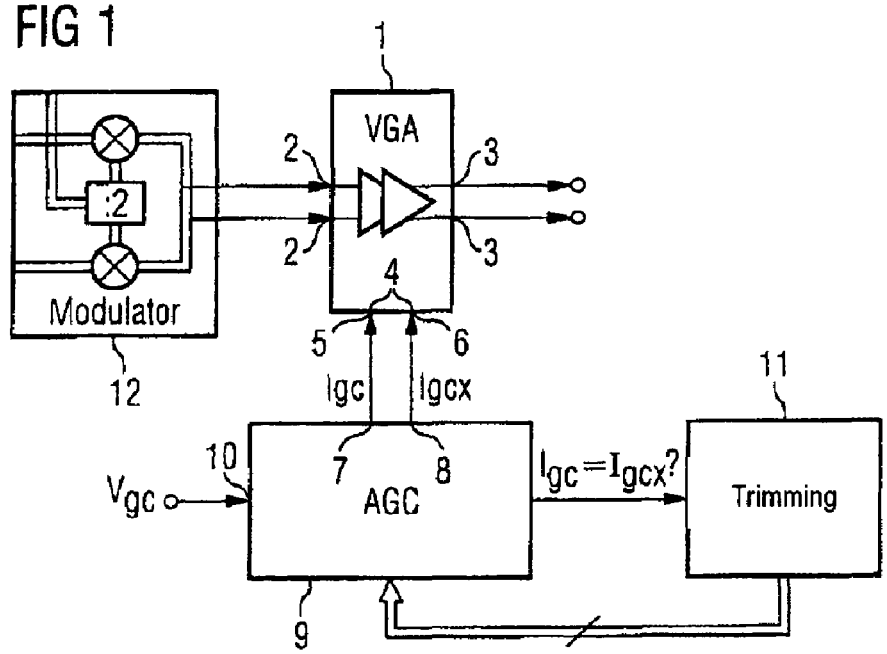
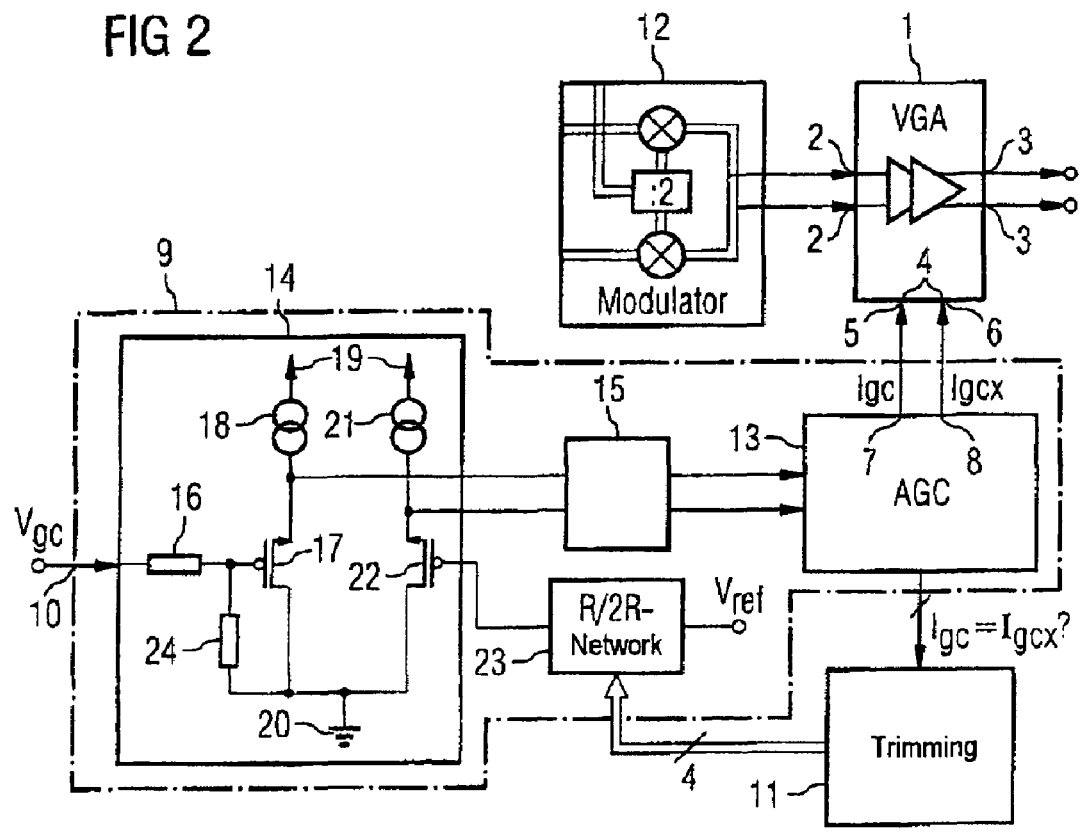

ADJUSTABLE GAIN AMPLIFIER ARRANGEMENT WITH RELAXED MANUFACTURING CONSTRAINTS

FIELD OF THE INVENTION

The present invention relates to an amplifier arrangement, and to a transmitting arrangement with the amplifier arrangement.

BACKGROUND OF THE INVENTION

A radio-frequency signal to be transmitted is normally amplified in the front end of a mobile radio before it is emitted via an antenna. The transmission is normally at a variable radio-frequency output power. This is matched, inter alia, to external characteristics such as the distance to a base station at that time.

In modern third-generation mobile radios which operate on the basis of the UMTS (Universal Mobile Telecommunications Standard) mobile radio standard, the radio-frequency output power has to be variable over a very wide range. A so-called VGA, Variable Gain Amplifier, is typically provided for this purpose in the transmission path of a corresponding communication appliance. An external control voltage is normally used to control the gain of this amplifier, with a signal to be transmitted being amplified as a function of this control voltage.

VGAs such as these are normally manufactured as integrated circuits. The use of mass-production methods for production of chips unavoidably means that manufacturing tolerances can occur. Manufacturing tolerances such as these can result in a shift in the characteristic of the VGA, specifically in its output power as a function of the control voltage. In consequence, there is no longer any guarantee of an unambiguous association between the external control voltage and the output power.

The described problem could be solved by calibration controlled by the baseband chip, which produces the external control voltage by means of an analog/digital converter, a so-called ADC. In this case, when the system is started, that is to say when it is switched on or started up, the control voltage is set successively from the minimum to the maximum voltage, and the associated radio-frequency output power is detected in each case. The association obtained in this way between the output power and the respective control voltage required for this purpose is stored in a table in the baseband chip. However, this method reaches its limits when the shift in the VGA characteristic becomes so great that the digitization range of the ADC being used is departed from. If the manufacturing tolerances are too great, it may then either no longer be possible to cover the entire power range, or, alternatively, an ADC with greater resolution must be used, that is to say an ADC with a greater number of bits, which can cover a wider voltage range. However, this is undesirably associated with additional complexity. An additional disadvantage is that calibrations during the manufacture of integrated circuits with a number of measurement points are associated with high production costs, and it is thus desirable to avoid such calibrations during manufacture, or to keep them as minor as possible.

An object of the present invention is to specify an amplifier arrangement and a transmitting arrangement with the amplifier arrangement, in which the amplifier can be adjusted over a wide range, and which arrangement is robust with respect to those manufacturing tolerances which affect the characteristic of the amplifier and for which the calibration complexity during manufacture is as low as possible.

SUMMARY OF THE INVENTION

According to exemplary embodiments, an amplifier arrangement includes: a signal amplifier with a signal input, with a signal output for tapping off an amplified signal, and with at least two control connections for setting the gain of the signal amplifier; a control block with a control input for supplying a set signal for the gain of the signal amplifier and with at least two output connections, which are connected to the at least two control connections of the signal amplifier in order to set the gain of the signal amplifier; and a trimming means, which is coupled to the control block, designed for trimming the signals which are produced at the at least two output connections of the control block relative to one another.

The desired set signal for the gain of the signal amplifier is applied as a control signal to the control input of the control block, which processes this control signal and supplies it to one or more connections of the signal amplifier. The control signal is, for example, applied to the input of the control block as a control voltage, which is also referred to as the gain control voltage. The signal which is produced by the control block and can be supplied to the signal amplifier may be a bias signal.

Furthermore, a trimming means is provided, which is designed and coupled to the control block such that a signal which is produced at at least one output connection of the control block is trimmed relative to a reference signal.

The trimming process may, for example, be carried out during a trimming mode. The trimming mode may advantageously be carried out, for example, even while the transmitter is being started up, so that no additional time is consumed.

The proposed principle of trimming one or more signals which are emitted from the control block and are supplied to the control connection or connections in order to set the gain of the signal amplifier, with respect to one another or with respect to a reference signal, is particularly advantageous because any shifts which may occur in the VGA characteristic are caused mainly by manufacturing tolerances in the control block.

The trimming process is carried out controlled by comparison values of the currents and/or voltages at the output connections of the control block relative to one another, and/or as a function of the control voltage that is in each case applied to the input of the control block, or of a control current.

One major advantage of the described trimming process is that there is no need to measure the radio-frequency output signal from the amplifier.

The reference signal is preferably produced in the control block.

In some embodiments, the control block has two output connections, which are connected to two control connections of the signal amplifier. The signals at the output connections are trimmed relative to one another.

The at least two control connections of the signal amplifier preferably form a difference signal input. In this case, the signal which is passed from the control block to the signal amplifier is in the form of a difference signal.

The control connections to the signal amplifier preferably form a difference signal input for supplying a balanced or differential bias current.

The control block is preferably designed to provide automatic gain control. Control blocks such as these are also referred to as AGCs.

The control block preferably has a converter which is designed to convert a gain control signal, which can be carried on a line, to a difference signal. The described principle is used particularly advantageously here, since, on the one hand, manufacturing tolerances in the components that are used have a particularly major disturbance influence on the formation of difference signals and, on the other hand, a mismatch such as this can be trimmed out in a particularly simple manner by the proposed principle.

By way of example, the converter may have at least one component with an adjustable value, which on the one hand can be adjusted by the trimming means, and which on the other hand influences the value of the current or voltage at least of a signal at the difference signal output of the control block.

The component with an adjustable value may, for example, be a resistance network.

The trimming means is preferably designed such that it operates iteratively using an approximation method. In this case, the adjustable value of the resistance network is influenced in a trimming mode in the control block until one of the two values which are produced at the connections of the difference signal input of the signal amplifier matches the value at the other connection of the difference signal input, or comes as close as possible to it.

In the iterative trimming process, the reference voltage, for example, is increased until one of the two bias currents at the two control connections is of the same magnitude as or is greater than the other.

In order to carry out the trimming process, an initialization is preferably carried out such that specific input variables are switched to defined internal states. This means that the programming of the control block is set to its initial values, and a set signal is produced at the control input internally in the amplifier arrangement.

The proposed principle considerably reduces the complexity for further trimming or calibration of the front end of a mobile radio transmitter, and analog/digital converters with a narrow voltage range and less resolution, that is to say with a small number of bits, can advantageously be used.

Since the trimming process requires only DC (Direct Current) signals, it can be carried out even while an amplifier or transmitting arrangement is being started up. Furthermore, there is advantageously no need for complex radio-frequency signal detection in order to carry out the proposed trimming process.

A transmitting arrangement can include an amplifier arrangement as described above, in which a modulator is provided for modulation of a data signal onto a carrier signal. This modulator is followed by the described signal amplifier with the control block and the trimming means.

The variable-gain amplifier arrangement and the transmitting arrangement with the amplifier arrangement can preferably be used in UMTS radios.

BRIEF DESCRIPTION OF THE DRAWINGS

The invention will be explained in more detail in the following text using a number of exemplary embodiments and with reference to the drawings, in which:

FIG. 1 shows exemplary embodiments of the invention, on the basis of a block diagram, FIG. 2 shows further exemplary embodiments of the invention, on the basis of a block diagram.

DETAILED DESCRIPTION

Figure 3:
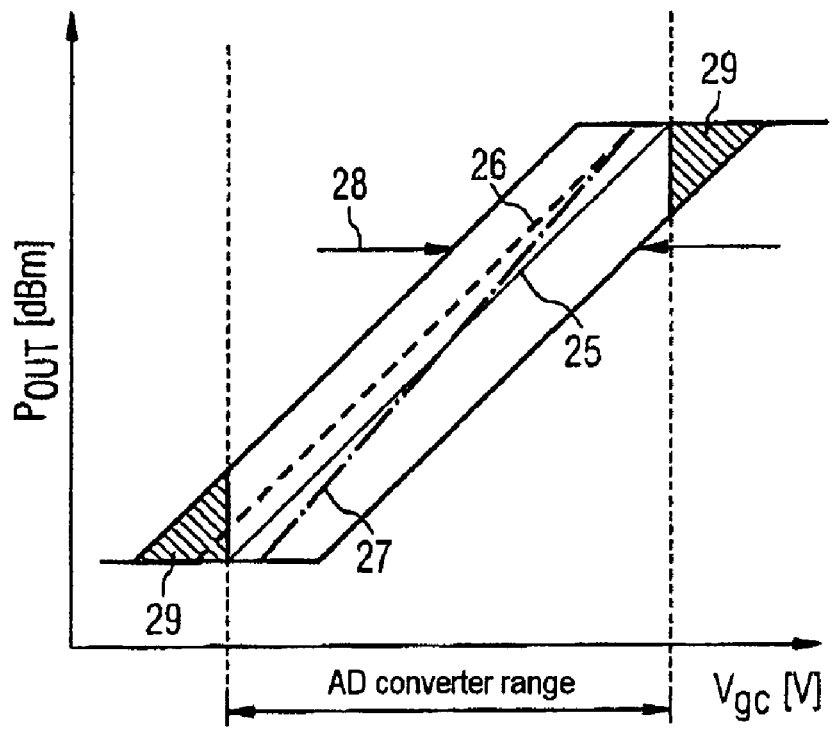
FIG. 3 shows the characteristic of a variable-gain amplifier.

Reference symbols in the drawings are:
1 Signal amplifier
2 Signal input
3 Signal output
4 Control input
5 Control connection
6 Control connection
7 Output connection
8 Output connection
9 Control block
10 Control input
11 Trimming unit
12 Quadrature modulator
13 Automatic gain control
14 Source follower circuit
15 Differential amplifier
16 Resistor
17 Transistor
18 Current source
19 Supply potential connection
20 Reference-ground potential connection
21 Current source
22 Transistor
23 Resistance network
24 Resistor
25 Nominal characteristic
26 Characteristic with an offset
27 Characteristic with a variable gradient
28 Tolerance band
29 Lost areas
30 Difference signal output
31 Resistor
32 Resistor FIG. 1 shows an amplifier arrangement according to the proposed principle on the basis of a first exemplary embodiment. A signal amplifier 1, whose gain is adjustable, is provided. The signal amplifier 1 has a signal input 2 and a signal output 3, which are each designed to carry difference signals. In addition, a further input is provided in order to set the gain 4, and this input has two control connections and is likewise in the form of a difference signal input. The control connections 5, 6 of the signal amplifier are in the form of current inputs for supplying respective bias currents in the form of a difference current signal. In particular, the difference bias current signal determines the operating point.

The control connections 5, 6 are each connected to one associated output connection 7, 8 of a control block 9. The control block 9 has a control input 10 for supplying a set signal, which is in the form of a voltage input for supplying a set gain voltage $V_{GC}$. The control block 9 processes the control signal in order to set the gain such that it is in the form of a difference signal and also results in a voltage signal being converted to a current signal. Furthermore, the control block 9 includes the function of automatic gain control for the amplifier 1. The control block 9 is connected to a trimming unit 11 which, in a trimming mode, compares the signal currents that can be tapped off at the output connections 7, 8 of the control block with one another and, if they differ from one another as a result of manufacturing tolerances or other scatter effects, acts on the control block 9, in particular on those function blocks which produce the current signals $I_{GC}$, $I_{GCX}$ at the output connections 7, 8, until these signal currents are of the same magnitude, or until the discrepancy between them is as small as possible.

FIG. 1 also shows a quadrature modulator 12, which mixes an IQ modulation signal (which is broken down into an in-phase component and a quadrature component) with a divided-down orthogonal local oscillator signal, and supplies the signal modulated in this way onto a radio-frequency carrier to the input 2 of the signal amplifier 1.

The internal trimming process in the control block 9 reduces fluctuations in the output power at the output 3 of the signal amplifier relative to the control voltage VGC to such an extent that no calibration, or only a low-complexity calibration, is required for a transmitting arrangement with the amplifier 1.

The described trimming process acts on the bias block of the amplifier 1, which is included in the control block 9, where it reduces the fluctuations which may occur as a result of manufacturing tolerances. Since shifts in the VGA (Variable Gain Amplifier) characteristic are caused mainly by manufacturing tolerances in the bias block of the VGA, the described principle makes it possible to significantly reduce the fluctuations in the VGA characteristic. According to the proposed principle, no complex RF signal detection is carried out as the trimming criterion and, instead, currents and voltages which are directly related to the output power of the VGA are in fact used as the trimming criterion. In the present case, these are the bias currents $I_{GC}$ and $I_{GCX}$, which can be stabilized by the described trimming process such that the operating points of the amplifier are also stabilized.

One major advantage of the proposed approach is that the trimming process acts on the control block of the amplifier itself, so that there is no need to detect the radio-frequency output signal from the amplifier, as is otherwise normally done.

The described trimming process in the radio-frequency section of a radio transmitter considerably reduces the trimming complexity in the baseband chip of a radio transmitter, and it is possible to use analog/digital converters with a narrower voltage range and less resolution in order to determine the control voltage for the gain set value. The proposed trimming process advantageously requires only DC signals and can therefore be carried out even while the transmitter is being started up. The trimming process is carried out automatically when the system is switched on, without being noticed by the user. A further advantage is that the described trimming process can take place without measuring the radio-frequency output signal from the amplifier.

FIG. 2 shows a development of the circuit shown in FIG. 1, with which it largely corresponds in terms of the functional units involved, their circuitry with respect to one another and the advantageous method of operation. To this extent, the description will not be repeated once again at this point.

The internal trimming process which is carried out by the trimming unit 11 acts, in the exemplary embodiment shown in FIG. 2, in the control block 9 for conversion of a single-ended signal to a signal, which can be carried on two lines, as will be explained in detail in the following text.

The control block 9 for the circuit shown in FIG. 2 has one block for automatic gain control 13 with two output connections 7, 8, which form a difference signal output of the control block. A bias current $I_{GC}$, $I_{GCX}$ in the form of a difference signal is produced at these output connections 7, 8. Furthermore, a source follower circuit 14 is provided and is included in the control block 9, whose input side is connected to the control input 10 for supplying the control signal $V_{GC}$, and whose output side uses a signal, which can be carried on two lines, to drive the automatic gain control block 13 via a differential amplifier 15. The source follower circuit 14 and the differential amplifier 15 together form a single-to-differential conversion, that is to say a circuit for conversion of a signal which can be carried on one line to a difference signal.

The control input 10 of the control block 9 is connected via a first resistor 16 to the gate connection of a p-channel MOS field-effect transistor 17. The source of this transistor 17 is connected via a current source 18 to a supply voltage connection 19, and its drain is connected to a reference ground potential 20. The gate connection of the transistor 17 is likewise connected to the reference ground potential 20, via a further resistor 24. A further current path is provided in parallel with this current path 17, 18, likewise comprising a current source 21 and a p-channel MOS field-effect transistor 22, which are connected in series between the supply and reference ground potential connections 19, 20. The gate connection of the transistor 22 is connected to a reference ground potential VREF via a resistance network 23. The resistance network 23 is driven by the trimming unit 11 via a multi-bit line.

Any offset which may be present in the amplifier characteristic can be trimmed out by varying the resistance ratios in the resistance network 23, by varying the reference ground voltage for the source follower circuit 14. By varying the resistance ratio of the resistor 16 to the resistor 24 at the control input 10, it is also possible to vary the gradient of the characteristic of the amplifier 1, that is to say to compensate for any gradient discrepancy from the nominal characteristic.

This trimming process is carried out by first of all switching to a defined internal state in a trimming mode. This means that the programming of the automatic gain control 13 is set to initial values, and an internally produced set voltage is applied to the control input 10. Then, starting from a low initial value, the reference voltage $V_{REF}$ on the resistance network 23 is increased in steps by means of this resistance network 23, using an iterative trimming process, until the bias current $I_{GC}$ which can be tapped off at the output connection 7 of the control block 9 is greater than or equal to the bias current $I_{GCX}$ which can be tapped off at the other output connection 8. The bias currents $I_{GC}$, $I_{GCX}$ in this case form the bias signal for the signal amplifier 1 in the form of a difference signal. When this condition is satisfied, the programming of the automatic gain control block 13 is reset to the original values, and the control input 10 is once again connected to the exterior, that is to say, for example, is driven by a baseband block which is connected upstream of the modulator 12.

The described trimming process requires only DC signals and can therefore be carried out even while the described circuit arrangement is being started up or switched on. No additional time is therefore consumed for the trimming process. This is particularly advantageous for use in mobile radios.

Furthermore, in the present case, there is also no need to detect the radio-frequency signal power at the output of the amplifier 1. Accordingly, with the proposed principle, it is not absolutely necessary to provide for a coupling from the signal output of the modulator 12 or from the output of the amplifier 1 to an input of the trimming unit 11.

It is, of course, within the scope of the proposed invention for the trimming unit 11 to drive not only a resistance network 23 which influences the reference voltage of the source follower circuit 14. A controllable resistance network such as this may additionally or alternatively also replace the resistors 16, 24 at the control input 10. This would then make it possible to trim out not only any offset in the VGC characteristic, but also to trim its gradient.

In the present case, the trimming unit 11 acts on the production of the bias currents $I_{GC}$, $I_{GCX}$ which drive the signal amplifier. Alternatively, and without departing from the scope of the invention, it would also be possible to use the trimming unit 11 to vary other signal parameters which influence the characteristic of the amplifier 1.

The proposed principle is not restricted to use in transmitting arrangements, but can be used in all circuit arrangements in which controllable amplifiers are used, which should be calibrated, without needing to detect the output signal from the amplifier.

By way of example, FIG. 3 shows a gain characteristic of a so-called variable gain amplifier VGA, as is provided as a variable signal amplifier 1 in the exemplary embodiments shown in FIGS. 1 and 2. This shows an ideally linear relationship between the control voltage $V_{GC}$ in volts and the output power POUT in dBmW of the amplifier based on the nominal characteristic 25. An offset in the characteristic, such as that which is produced, when manufacturing tolerances occur, is illustrated by way of example on a characteristic 26. Additionally or alternatively, manufacturing tolerances can also lead to a variation in the gradient of the characteristic. A characteristic such as this is annotated with the reference symbol 27. The scatter range which occurs as a result of manufacturing tolerances in the example of a manufacturing process for an integrated semiconductor circuit is identified by the reference symbol 28. As can be seen, shaded areas 29 occur within these manufacturing scatter limits, which denote areas in which driving is no longer possible for a predetermined quantization range of an analog/digital (A/D) converter for processing the control voltage $V_{GC}$.

As explained above, the proposed principle makes it possible to return the amplifier characteristic to the quantization range of the A/D converter without needing to carry out a complex trimming process by measurement of the RF output power.

Figure 4:
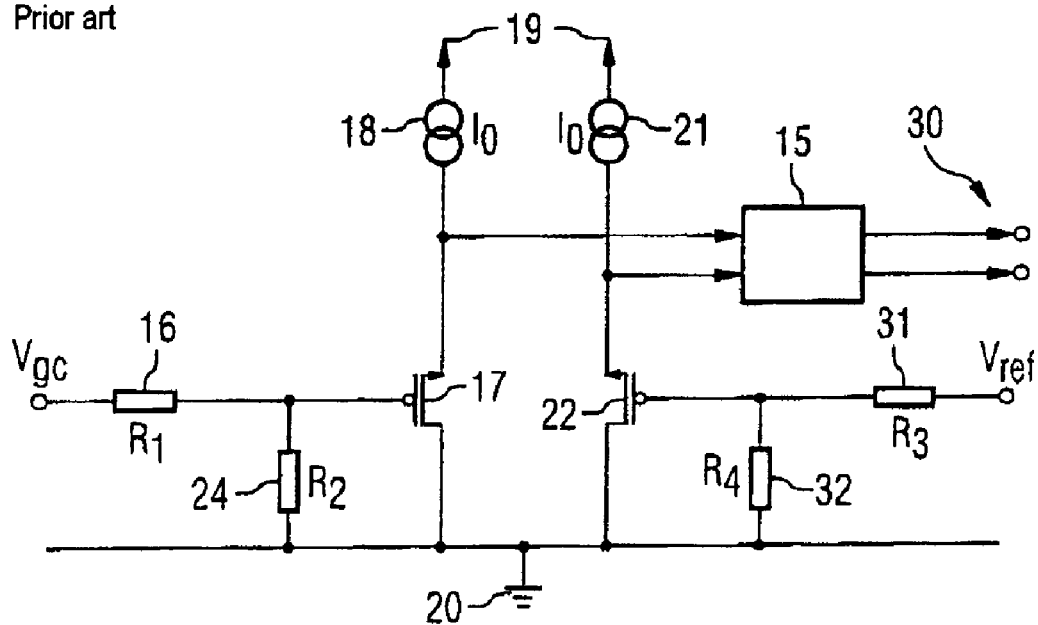
FIG. 4 shows a circuit diagram of one prior art example of a circuit for conversion of a signal, which can be carried on a line, to a difference signal.

By way of example, FIG. 4 shows a conversion circuit according to the prior art, which converts a signal that is applied to the input side and can be carried on one line, a so-called single-ended signal $V_{GC}$, to a corresponding difference signal which can be tapped off at the output 30. FIG. 4 uses a voltage divider, which has two resistors 31, 32. Varying the ratio of the resistances of the resistors 16, 24 varies the gradient of the characteristic of the amplifier 1, while variation of the ratio of the resistances of the resistors 31, 32 influences the offset of the characteristic of the VGA 1.

Although exemplary embodiments of the invention are described above in detail, this does not limit the scope of the invention, which can be practiced in a variety of embodiments.

What is claimed is:

1. An amplifier apparatus, comprising:
   a signal amplifier including a signal input for receiving a signal to be amplified, a signal output for providing an amplified signal, and at least two control connections for setting a gain of the signal amplifier;
   a control block including a control input for receiving a control signal, and including at least two output connections which are connected to the at least two control connections, the control block responsive to the control signal for producing at the output connections respective control block output signals; and
   a trimming unit coupled to the control block for trimming the control block output signals relative to one another.

2. The apparatus of claim 1, wherein the control connections form a difference signal input of the signal amplifier.

3. The apparatus of claim 2, wherein the control input includes only a single node, the control signal is a single node signal, and the control block includes a converter for converting the single node signal into a difference signal.

4. The apparatus of claim 3, wherein the converter includes an adjustable component, the trimming unit for adjusting the adjustable component.

5. The apparatus of claim 4, wherein the adjustable component is a resistance network.

6. The apparatus of claim 5, wherein each of the control block output signals has a quantifiable characteristic, and wherein the trimming unit is for adjusting the resistance network until a value of the quantifiable characteristic of one of the control block output signals is at least as high as a value of the quantifiable characteristic of the other of the control block output signals.

7. The apparatus of claim 6, wherein the control block is for performing automatic gain control with respect to the gain of the signal amplifier.

8. The apparatus of claim 5, wherein the control block is for performing automatic gain control with respect to the gain of the signal amplifier.

9. The apparatus of claim 4, wherein the control block is for performing automatic gain control with respect to the gain of the signal amplifier.

10. The apparatus of claim 3, wherein the control block is for performing automatic gain control with respect to the gain of the signal amplifier.

11. The apparatus of claim 2, wherein the control block is for performing automatic gain control with respect to the gain of the signal amplifier.

12. The apparatus of claim 1, wherein the control block is for performing automatic gain control with respect to the gain of the signal amplifier.

13. The apparatus of claim 1, wherein the control input includes only a single node, the control signal is a single node signal, and the control block includes a converter for converting the single node signal into a difference signal.

14. The apparatus of claim 13, wherein the converter includes an adjustable component, the trimming unit for adjusting the adjustable component.

15. The apparatus of claim 14, wherein the adjustable component is a resistance network.

16. The apparatus of claim 15, wherein each of the control block output signals has a quantifiable characteristic, and wherein the trimming unit is for adjusting the resistance network until a value of the quantifiable characteristic of one of the control block output signals is at least as high as a value of the quantifiable characteristic of the other of the control block output signals.

17. The apparatus of claim 16, wherein the control block is for performing automatic gain control with respect to the gain of the signal amplifier.

18. The apparatus of claim 15, wherein the control block is for performing automatic gain control with respect to the gain of the signal amplifier.

19. The apparatus of claim 14, wherein the control block is for performing automatic gain control with respect to the gain of the signal amplifier.

20. The apparatus of claim 13, wherein the control block is for performing automatic gain control with respect to the gain of the signal amplifier.

21. The apparatus of claim 1, wherein the signal amplifier is a radio frequency signal amplifier.

22. A transmitter apparatus, comprising:
- a signal amplifier including a signal input for receiving a signal to be amplified, a signal output for providing an amplified signal, and at least two control connections for setting a gain of the signal amplifier;
- a control block including a control input for receiving a control signal, and including at least two output connections which are connected to the at least two control connections, the control block responsive to the control signal for producing at the output connections respective control block output signals;
- a trimming unit coupled to the control block for trimming the control block output signals relative to one another; and
- a modulator for modulation of a data signal onto a carrier signal, the modulator having an output coupled to the signal input of the signal amplifier.

23. The apparatus of claim 22, provided as a Universal Mobile Telecommunications Standard (UMTS) radio transmitter apparatus.

* * * * *